(12) United States Patent
Haas et al.

(10) Patent No.: US 6,179,210 B1
(45) Date of Patent: Jan. 30, 2001

(54) PUNCH OUT PATTERN FOR HOT MELT TAPE USED IN SMARTCARDS

(75) Inventors: Kevin L. Haas, Bartlett; Kiron P. Gore, Libertyville, both of IL (US)

(73) Assignee: Motorola, Inc., Schaumburg, IL (US)

( * ) Notice: Under 35 U.S.C. 154(b), the term of this patent shall be extended for 0 days.

(21) Appl. No.: 09/247,714

(22) Filed: Feb. 9, 1999

(51) Int. Cl.[7] .................................................. G06K 19/02
(52) U.S. Cl. ........................................... 235/488; 235/492
(58) Field of Search ..................... 257/669, 676, 257/684, 678, 666; 235/492, 488, 441, 375; 361/402; 357/74, 79, 80; 283/83, 904

(56) References Cited

U.S. PATENT DOCUMENTS

| | | | |
|---|---|---|---|
| 4,417,413 | * 11/1983 | Hoppe et al. ............................ | 40/630 |
| 4,463,971 | * 8/1984 | Hoppe et al. ............................ | 283/83 |
| 4,639,585 | * 1/1987 | Haghiri-Tehrani et al. ........... | 235/492 |
| 4,764,803 | * 8/1988 | Ueda ........................................ | 357/72 |
| 4,897,534 | * 1/1990 | Haghiri-Tehrani et al. ........... | 238/488 |
| 5,027,190 | * 6/1991 | Haghiri-Tehrani et al. ........... | 357/74 |
| 5,031,026 | * 7/1991 | Ueda ........................................ | 357/74 |
| 5,055,913 | * 10/1991 | Haghiri-Tehrani .................... | 357/74 |
| 5,208,450 | * 5/1993 | Uenishi et al. ......................... | 235/492 |
| 5,550,402 | * 8/1996 | Nicklaus ................................. | 257/669 |
| 5,554,885 | * 9/1996 | Yamasaki et al. ..................... | 257/666 |
| 5,834,755 | * 11/1998 | Haghiri-Tehrani et al. ........... | 235/492 |
| 5,856,662 | * 1/1999 | Kohama et al. ....................... | 235/492 |

* cited by examiner

*Primary Examiner*—Thien M. Le
(74) *Attorney, Agent, or Firm*—Wayne J. Egan

(57) ABSTRACT

An improved punch out pattern for a hot melt tape used in smartcard manufacture. The hot melt tape is provided with punch out channels that direct the overflow of conductive adhesive away from the surface of the hot melt tape. In a preferred embodiment, the punch out channels are dimensioned to direct the overflow away from one another and toward a module receiving cavity formed in the smartcard body. In an alternate embodiment where it may not be feasible to direct overflow toward the overmold receiving cavity without affecting the electrical or mechanical performance of the smartcard, the punch out channels are dimensioned to direct overflow away from one another and along the periphery of the hot melt tape area. In either scenario, the channels do not interfere with module adhesion and, by virtue of the channeling of overfill matter, direct the conductive adhesive away from other connections in close vicinity and thus avoid the possibility of shorting.

16 Claims, 3 Drawing Sheets

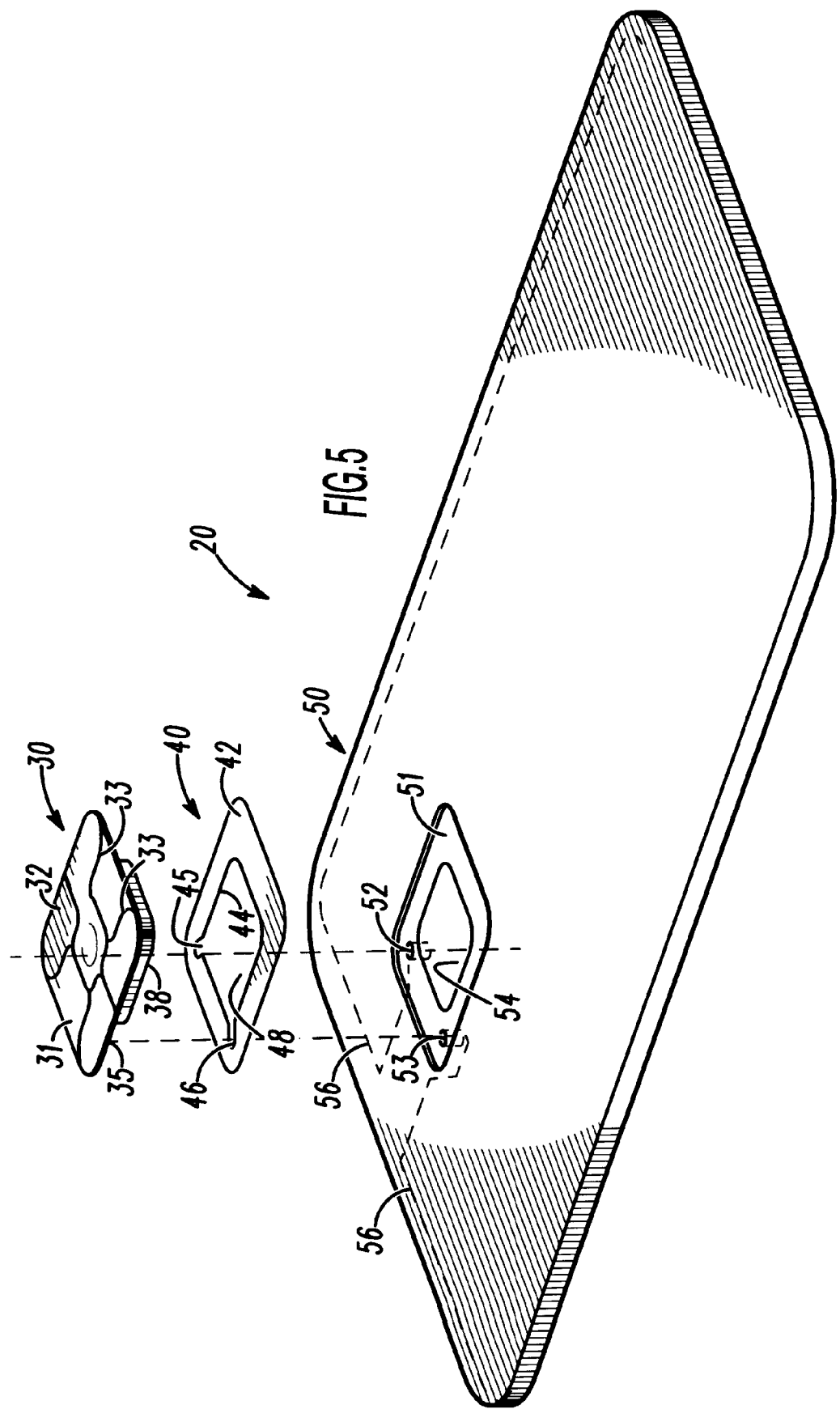

PUNCH OUT PATTERN FOR HOT MELT TAPE USED IN SMARTCARDS

FIELD OF THE INVENTION

The present invention relates generally to microelectronic assemblies, and more particularly, to dual mode smartcards and to punch out patterns in the hot melt tape used in such dual mode smartcards.

BACKGROUND OF THE INVENTION

Dual mode smartcards typically contain an antenna embedded in a smartcard body and a module encapsulating a microprocessor coupled to a substrate surface, the latter provided with external leads for contacted smartcard operation to a card reader.

The smartcard body and module are matedly attached using a conductive adhesive. The conductive adhesive is typically deposited in each of two vias buried within the smartcard body. The vias are formed by milling the smartcard body to a depth sufficient to expose associated antenna leads buried in the smartcard body. After the vias (or antennas exposing cavities) are formed, they are filled with the conductive adhesive and the module properly aligned in mated fashion on top of the smartcard body, resulting in an electrical connection between the antenna and module by way of the conductive adhesive.

A critical element of smartcard manufacture is that dispensed volumes of conductive adhesive need to be precisely controlled in order not to overfill the vias. To date this has been inadequately achieved by using what is known as a non-conductive hot melt tape having a specific punch out pattern. The hot melt tape 10 includes three cut outs, an overmold receiving cavity (11) and two circular punch out holes 12, 13, as shown in FIG. 1. Circular punch out holes 12 and 13 are substantially the diameter of corresponding vias on the smartcards, over which the hot melt tape is superimposed during smartcard assembly.

Before combining the top surface of the smartcard body to the bottom surface of the module, the hot melt tape 10 is first adhesively bonded to the bottom surface of the module. The punch out holes 12 and 13 are dimensioned to expose corresponding electrical contact areas on the bottom surface of the module. Once the hot melt tape is affixed to the module, both vias on the smartcard body are filled with the conductive adhesive. The module (with hot melt tape) are then brought together with the smartcard body. In an ideal situation, when filling the vias, only enough adhesive is provided as necessary to fill the punch out holes 12, 13 sufficiently, and without overfill, so that contact is made between adhesive and the exposed electrical contact areas on the bottom surface of the module.

FIG. 2 shows the smartcard body facing surface of the hot melt tape with no overflow 14 having spread onto the surface area.

If overfill 14' does occur, and often times does occur, as shown in FIG. 3, it can lead to contamination of the hot melt tape around one or both vias and also result in insufficient adhesion of the module to the smartcard body. Insufficient adhesion around the via could result in a weak (or intermittent) electrical connection, particularly when the smartcard is bent—as expected to occur during normal use by its owner. Also, the overfill from adjacent connections could migrate towards each other and result in an electrical short, as shown by 14" in FIG. 4.

Controlling the dispensed volume of viscous materials like conductive adhesive has always been very difficult. Several issues, such as changing viscosity as the material cures, differing viscosity within the same tube of material, and differing viscosity between lots of material are the cause of the dispensing inaccuracies.

It would be a great advance in the art of smartcard manufacture to be able to provide a solution to the problem of overflowing conductive adhesive.

BRIEF DESCRIPTION OF THE DRAWINGS

FIG. 5 is an exploded, perspective view of a dual mode smartcard including a hot melt tape punch pattern in accordance with a first illustrative embodiment of the present invention.

DETAILED DESCRIPTION OF THE PREFERRED EMBODIMENTS

Generally, the present invention is directed to an improved punch out pattern for a hot melt tape used in smartcard manufacture. The hot melt tape is provided with punch out channels that direct the overflow of conductive adhesive away from the surface of the hot melt tape. In a preferred embodiment, the punch out channels are dimensioned to direct the overflow away from one another and toward a module receiving cavity formed in the smartcard body. In an alternate embodiment where it may not be feasible to direct overflow toward the overmold receiving cavity without affecting the electrical or mechanical performance of the smartcard, the punch out channels are dimensioned to direct overflow away from one another and along the periphery of the hot melt tape area. In either scenario, the channels do not interfere with module adhesion and, by virtue of the channeling of overfill matter, direct the conductive adhesive away from other connections in close vicinity and thus avoid the possibility of shorting.

Figure 6:
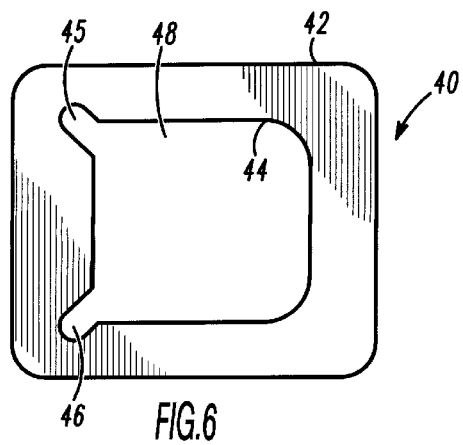
FIG. 6 illustrates a surface view of the hot melt tape punch pattern utilized in the smartcard shown in FIG. 5.
Figure 7:
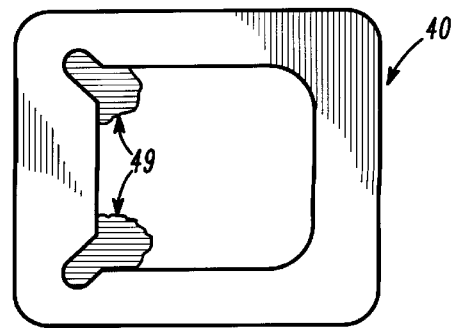
FIG. 7 shows overflow channeled and directed towards overmold.

The present invention will now be described in greater detail with reference to FIGS. 5–7.

FIG. 5 is an exploded, perspective view of a microelectronic assembly, and in particular, a dual mode smartcard 20 constructed in accordance with the present invention. Smartcard 20 includes a module 30, a hot melt tape 40 and an antenna encapsulating body portion (smartcard body) 50.

Module 30 is of known construction and consists of a substrate 31, an upper surface 32 of which includes smartcard contacted leads 33, for interfacing, in contacted mode, to an external smartcard reader device (not shown). A bottom surface 35 of module 30 includes an etched circuit pattern (not shown) including electrical contact areas in electrical connection with an IC 37, such as a Motorola HC05 based microprocessor, housed within overmold 38.

Hot melt tape 40 is a hot melt adhesive, such as 8410, and is characterized by a top surface 42, facing bottom surface 35 of module 30, and by an opposite surface 44 facing smartcard body 50. Punch-out channels 45 and 46 are provided which bleed into a rectangular opening 48 formed in the center of the hot melt tape 40. The opening 48 is sized to allow the hot melt tape 40 to slip around the overmold 38 protruding form the bottom surface 35 of the module 30. Also, channels 45 and 46 are each similarly sized such that an inner circumference thereof is substantially coaxial with the electrical contact areas etched on the bottom surface 35 of module 30. A planar view of top surface 42 (same as opposite surface 44) of hot melt tape 40 is shown in greater detail in FIG. 6.

Smartcard body 50 includes a module receiving cavity 51, first and second antenna exposing cavities (vias) 52, 53, overmold receiving cavity 54, and an embedded antenna 56. First and second antenna leads 57 and 58 of antenna 57 are exposed to the outside at base surfaces 59, 60, respectively, of associated first and second antenna exposing cavities 52, 53. Antenna exposing cavities 52 and 53 are also substantially coaxial with corresponding ones of punch-out channels 45, 46 and electrical contact areas (not shown).

Antenna 56 facilitates contactless mode of operation for the dual mode smartcard described herein.

During smartcard assembly, the hot melt tape 40 is affixed to the bottom surface 35 of module 30 in alignment therewith.

Conductive adhesive (epoxy) is deposited into antenna exposing cavities 52, 53 and then the module 30, together with affixed hot melt 40, is brought together with smartcard body 50. Excess conductive adhesive, by virtue of the open-channel dimensioning of punch out channels 45, 46 of hot melt tape 40, is caused to leak through the channel open area in the direction of overmold receiving region 54 and module overmold 38 disposed vertically therein after assembly (see FIG. 7).

The hot melt tape punch out pattern described above and shown in FIGS. 6 and 7 ensures neither electrical nor mechanical performance is compromised by the presence of excess conductive adhesive, flowing in channels 45, 46, directed toward the overmold 38, away from one another, and away from the surfaces between the smartcard body 50 and the hot melt tape 40.

Figure 8:
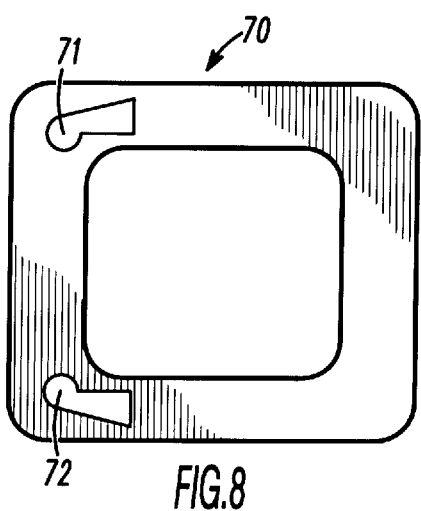
FIG. 8 illustrates a surface view of a hot melt tape punch pattern in accordance with a second illustrative embodiment of the present invention.
Figure 9:
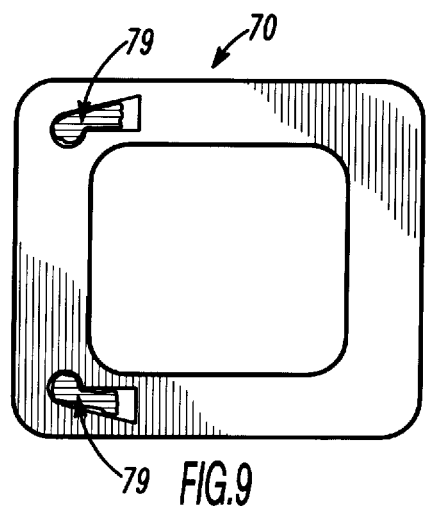
FIG. 9 show overflow channeled and directed towards periphery of hot melt tape.

In cases where the architecture of a smartcard does not allow for excess overflow to be directed toward overmold 38 without compromising its integrity, it suffices to instead contain the excess by spatially arranging the punch-out channels toward the periphery of the hot melt tape, as illustrated in FIG. 8 showing an alternate preferred embodiment. Punch out channels 71, 72 of hot melt tape 70 are shown as closed-ended channels and sized to sufficient predetermined parameters to contain excess overflow 79 (FIG. 9).

Figure 1:
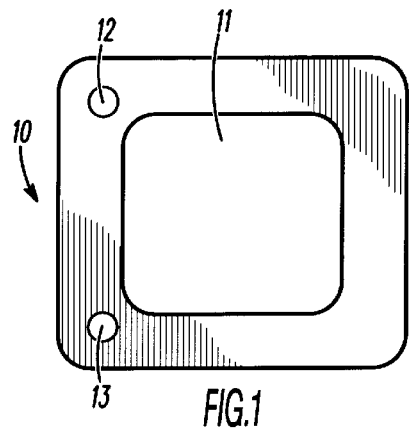
FIG. 1 illustrates a punch pattern of a hot melt tape as presently used in the manufacture of smartcards.
Figure 2:
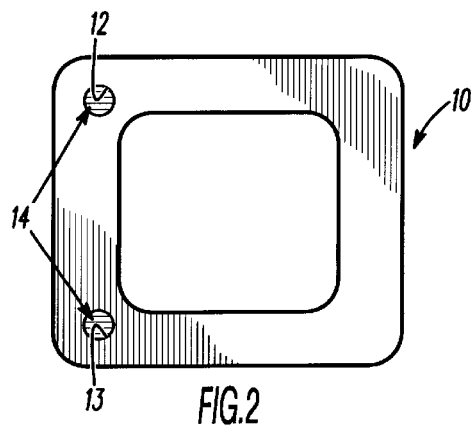
FIG. 2 illustrates the smartcard body facing surface view of the hot melt tape of FIG. 1 with no overflow of conductive adhesive shown having leaked on the surface.
Figure 3:
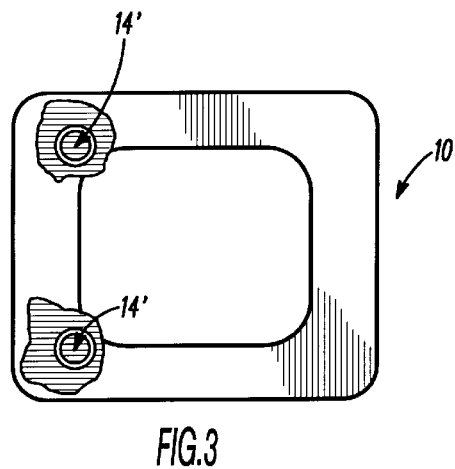
FIG. 3 illustrates the smart card body facing surface view of the hot melt tape of FIG. 1 with some overflow of conductive adhesive shown having leaked on the surface between tape and smartcard body. Module adhesion problem is shown.
Figure 4:
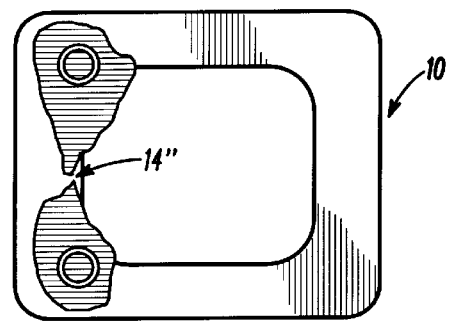
FIG. 4 illustrates the smartcard body facing surface view of the hot melt tape of FIG. 1 with excessive overflow of conductive adhesive shown having leaked on the surface. Shorting and module adhesion problem are shown.

In the unlikely event that some overflow spreads outside channels 45, 46 (or channels 71, 72) onto the surface area of the hot melt tape, the adhesion properties of the module to the smartcard body will be compromised to some degree. Overall, however, because the round hole punch pattern of prior smartcard assembly implementations (such as shown in FIG. 1) is replaced with a punch pattern including channels capable of directing most if not all likely overflow of deposited conductive adhesive in a predetermined direction—resulting in less constraints being placed on control of the dispensed volume of conductive adhesive—adhesion and shorting problems are all but eliminated.

Channeled punch patterns as illustrated in the preferred embodiments exceeded expectations in that it was proven possible to manufacture very reliable and robust interconnect dual mode smartcards capable of withstanding six times ISO recommended stress test requirements. It should be appreciated that because hot melt tape has a thickness of only approximately 0.005 inches, one skilled in the art of smartcard assembly would not find it intuitive that benefits could be realized by merely changing the hot melt tape punch pattern, which of course are realized as has been shown.

The benefits realized by adding channels now makes possible the manufacture of dual mode smartcards in volumes not previously attainable, and with significantly lower rejected components, without the cost of very accurate dispensing equipment.

Furthermore, the above benefits are realized without changes to the existing architecture of the smartcard module and/or smartcard body—except for minimal changes necessary to avoid electrical shorting possible resulting from increased exposed module and smartcard body surface areas.

In sum, significant and unexpected results are achieved by a channeled punch pattern in the hot-melt tape where channels are used, instead of holes, to capture and direct the overflow of conductive adhesive. These channels can be placed in the hot-melt tape at no added material, process, or manufacturing cost. Using the proposed solution, purchase or development of very accurate dispensing equipment is avoided. The prior art of punched round holes required much more accurate control of dispensed volume, which is extremely difficult.

While the present invention has been particularly shown and described with reference to particular embodiments thereof, it will be understood by those skilled in the art that various changes in form and details may be made therein without departing from the spirit and scope of the present invention.

We claim:

1. A microelectronic assembly comprising an antenna encapsulated body portion having a antenna exposing cavity and a module receiving cavity, a module including an integrated circuit, and a hot melt tape contacted on a first surface area to a surface of the module and at an opposite surface area to a base surface of the module receiving cavity, the hot melt tape including at least two punch-out channels each providing a path for a conductive adhesive deposited in the antenna exposing cavity extending beyond the base surface of the module receiving cavity to the module, said punch-out channels being spatially arranged to direct overflow of conductive adhesive away from one another.

2. The microelectronic assembly of claim 1, wherein the microelectronic assembly is a smartcard and said IC is a microprocessor.

3. The microelectronic assembly of claim 2, wherein the antenna encapsulated body portion further includes an overmold receiving cavity in proximity to the antenna exposing cavity, said punch-out channels being further spatially arranged to direct the overflow of conductive adhesive toward the overmold receiving cavity in a manner not affecting performance of the smartcard.

4. The microelectronic assembly of claim 2, wherein the antenna encapsulated body portion further includes an overmold receiving cavity in proximity to the antenna exposing cavity, said punch-out channels being spatially arranged to direct the overflow of conductive adhesive both away from one another as well as away from the overmold receiving cavity so as not to affect performance of the smartcard.

5. The microelectronic assembly of claim 1, wherein the microelectronic assembly is a dual mode smartcard and said IC is a microprocessor.

6. The microelectronic assembly of claim 5, wherein the antenna encapsulated body portion further includes an overmold receiving cavity in proximity to the antenna exposing cavity, said punch-out channels being further spatially arranged to direct the overflow of conductive adhesive toward the overmold receiving cavity in a manner not affecting performance of the smartcard.

7. The microelectronic assembly of claim 5, wherein the antenna encapsulated body portion further includes an overmold receiving cavity in proximity to the antenna exposing cavity, said punch-out channels being spatially arranged to direct the overflow of conductive adhesive both away from one another as well as away from the overmold receiving cavity so as not to affect performance of the smartcard.

8. The microelectronic assembly of claim 1, wherein the antenna encapsulated body portion includes an antenna comprised of plural antenna leads, said punch-out channels providing a path from associated antenna leads, exposed at a base surface of the antenna exposing cavity, to the module.

9. A hot melt tape for use in a microelectronic assembly to be disposed between an antenna encapsulated body portion, having a antenna exposing cavity and a module receiving cavity, and a module comprising an integrated circuit, the hot melt tape including at least two punch-out channels each providing a path for a conductive adhesive deposited in the antenna exposing cavity extending beyond the base surface of the module receiving cavity to the module during formation of the microelectronic assembly, said punch-out channels being spatially arranged to direct overflow of conductive adhesive away from one another.

10. The hot melt tape of claim 9, wherein the microelectronic assembly is a smartcard and said IC is a microprocessor.

11. The hot melt tape of claim 10, wherein the antenna encapsulated body portion further includes an overmold receiving cavity in proximity to the antenna exposing cavity, said punch-out channels being further spatially arranged to direct the overflow of conductive adhesive during microelectronic assembly formation toward the overmold receiving cavity in a manner not affecting performance of the smartcard.

12. The hot melt tape of claim 10, wherein the antenna encapsulated body portion further includes an overmold receiving cavity in proximity to the antenna exposing cavity, said punch-out channels being spatially arranged to direct the overflow of conductive adhesive during microelectronic assembly formation both away from one another as well as away from the overmold receiving cavity so as not to affect performance of the smartcard.

13. The hot melt tape of claim 9, wherein the microelectronic assembly is a dual mode smartcard and said IC is a microprocessor.

14. The hot melt tape of claim 13, wherein the antenna encapsulated body portion further includes an overmold receiving cavity in proximity to the antenna exposing cavity, said punch-out channels being further spatially arranged to direct the overflow of conductive adhesive during microelectronic assembly formation toward the overmold receiving cavity in a manner not affecting performance of the smartcard.

15. The hot melt tape of claim 13, wherein the antenna encapsulated body portion further includes an overmold receiving cavity in proximity to the antenna exposing cavity, said punch-out channels being spatially arranged to direct the overflow of conductive adhesive during microelectronic assembly formation both away from one another as well as away from the overmold receiving cavity so as not to affect performance of the smartcard.

16. The hot melt tape of claim 9, wherein the antenna encapsulated body portion is of the type including an antenna comprised of plural antenna leads, said punch-out channels providing a path from associated antenna leads, exposed at a base surface of the antenna exposing cavity, to the module during microelectronic assembly formation.

* * * * *